United States Patent
Kiehl

(10) Patent No.: US 6,489,809 B2
(45) Date of Patent: Dec. 3, 2002

(54) CIRCUIT FOR RECEIVING AND DRIVING A CLOCK-SIGNAL

(75) Inventor: Oliver Kiehl, Charlotte, VT (US)

(73) Assignee: Infineon Technologies AG, Munich (DE)

( * ) Notice: Subject to any disclaimer, the term of this patent is extended or adjusted under 35 U.S.C. 154(b) by 230 days.

(21) Appl. No.: 09/726,889

(22) Filed: Nov. 30, 2000

(65) Prior Publication Data

US 2002/0135396 A1 Sep. 26, 2002

(51) Int. Cl.⁷ ............................................. H03K 17/16
(52) U.S. Cl. ............................ 326/83; 326/87; 326/27
(58) Field of Search ......................... 326/83, 86, 87, 326/26, 27

(56) References Cited

U.S. PATENT DOCUMENTS

| | | |
|---|---|---|
| 4,431,930 A | 2/1984 | Monticelli |
| 4,575,859 A | 3/1986 | Ollendick |
| 4,745,365 A | 5/1988 | Ugenti |
| 4,775,807 A | 10/1988 | Bukowski, Jr. |
| 5,065,412 A | 11/1991 | Schenk |
| 5,128,555 A | 7/1992 | Millman |
| 5,327,072 A | 7/1994 | Savignac et al. |
| 5,534,791 A * | 7/1996 | Mattos et al. ................. 326/27 |
| 5,796,281 A | 8/1998 | Saeki et al. |
| 5,841,702 A * | 11/1998 | Kim ............................ 326/27 |
| 6,272,577 B1 * | 8/2001 | Leung et al. ................ 326/121 |
| 6,275,082 B1 * | 8/2001 | Kiehl et al. ................. 327/108 |

OTHER PUBLICATIONS

Figures from: Baker et al., *CMOS Circuit Design, Layout and Simulation*, IEEE Press, 1998.

* cited by examiner

Primary Examiner—Don Phu Le
(74) Attorney, Agent, or Firm—Stanton Braden

(57) ABSTRACT

A receiver circuit includes a first circuit having two modes of operation controlled by a feedback loop. The feedback loop is connected to an output of the first circuit, and the modes of operation include a first mode having a quicker response to an input falling signal edge than a second mode and a second mode with a quicker response to an input rising signal edge than the first mode. A driver stage is integrated into the first circuit to favor the rising edge or the falling edge in accordance with a control signal provided by the feedback loop.

38 Claims, 6 Drawing Sheets

CIRCUIT FOR RECEIVING AND DRIVING A CLOCK-SIGNAL

BACKGROUND

1. Technical Field

This disclosure relates to receiver circuits, and more particularly, to a receiver circuit adapted to both receive and drive signals which is immune from noise superimposed to a signal during or after a signal transition.

2. Description of the Related Art

Digital circuits may be subject to noisy signals. Noisy signals may result in bit errors when converting the analog waveforms to digital signals. Noise suppression can reduce noise. For example, in receiver circuits that convert (noisy) analog input signals to digital on-chip signals, hysteresis is one means to suppress noise. Instances of slope reversal caused by reflections on ill terminated signal traces and extremely slow transitions (e.g., in burn-in test setups for semiconductor device tests) superimposed with random noise can cause incomplete pulses and spikes of the on-chip digital signals. This can cause malfunction of circuitry that assumes certain minimum and maximum pulse widths.

A structure of a differential amplifier-based receiver is shown in FIG. 1. A first stage 10 includes an N-channel differential pair 11 with a P-channel current mirror 13. A second stage 12 is realized by an inverter 14. One advantage of this configuration is that a switch-point is very well defined by the reference voltage VREF. The switch-point is the input voltage level (VIN) at which the output switches. For good system performance, a hysteresis of about 5–10% of the input voltage (VIN) swing is desirable. For stub series terminated logic (SSTL-2, for example), this would be a few tens of mV's.

In a conventional clock path, a clock signal is first converted to CMOS levels by receiver circuit 10. The CMOS levels are fed into a driving stage 20 which is capable of driving a large capacitive internal load of several pF's (e.g., ($C_{load}$))

Driver stage 20 shapes the pulses to fine tune them for use by other circuits. Driver stage 20 may include an inverter driver stage, a self-reset skewed one-shot pulse shaper or a dual skewed driver stage (e.g. as shown in U.S. Pat. No. 5,128,555). Driver stage 20 requires a noise-free CMOS signal at its input to function properly.

Therefore, a need exists for a circuit which incorporates both receiver and driver functions in a single unit to reduce the overall delay and power consumption over prior art solutions.

SUMMARY OF THE INVENTION

A receiver circuit includes a first circuit having two modes of operation controlled by a feedback loop. The feedback loop is connected to an output of the first circuit, and the modes of operation include a first mode having a quicker response to an input falling signal edge than a second mode and a second mode with a quicker response to an input rising signal edge than the first mode. A driver stage is integrated into the first circuit to favor the rising edge or the falling edge in accordance with a control signal provided by the feedback loop.

In other embodiments, the driver stage may include an inverter chain. The inverter chain preferably includes NMOS and PMOS transistors, the NMOS and the PMOS transistors having skewed strengths to favor one of the rising and falling edges. The driver stage is preferably capable of driving digital and analog signals input thereto. At least one current source is preferably coupled to the driver stage to provide driving current to the output in accordance with the control signal. The first circuit may include a switching circuit having switching elements switched by the control signal to alternately select circuit elements which favor a rising edge and a falling edge. The first circuit may include a differential amplifier. The feedback loop may include delay elements such that noise after a transition in the input signals is suppressed for a delay period provided by the delay elements. The feedback loop may be programmable to adjust the delay period provided by the delay elements. The feedback loop may be controlled by a control circuit to adjust the delay period provided by the delay elements. The delay period may be controlled in accordance with an input signal input to the receiver circuit.

Another receiver circuit includes a first stage having an input for receiving input signals and an output node, the first stage including an amplifier. A second stage has an input coupled to the output of the first stage. The second stage includes a switching circuit coupled to the output node of the first stage for driving the input signals by favoring one of a rising edge or a falling edge in accordance with a control signal. A feedback loop is coupled to an output of the second stage, the feedback loop providing the control signal for switching the switching circuit to favor the rising edge or falling edge. At least one driver stage is integrated into the second stage and coupled to the switching circuit for favoring the rising edge or the falling edge in accordance with the control signal.

In other embodiments, the second stage may include an inverter coupled to the output of the first stage, the inverter having an output representing the output of the receiver circuit. The second stage may include a first transistor coupled between the output of the inverter and a supply voltage and a second transistor coupled between the output of the inverter and a ground, wherein the first and second transistors have different strengths relative to transistors of the inverter to provide skewed driver strength for driving the input signals to the output of the second stage. The at least one driver stage may include a first driver stage coupled to a gate of the first transistor and coupled to the switching circuit. The at least one driver stage may include a second driver stage coupled to a gate of the second transistor and coupled to the switching circuit. The second stage may include at least one current source coupled to the at least one driver stage to provide driving current to a gate of one of the first and second transistors through the at least one driver stage in accordance with the control signal.

In still other embodiments, the switching circuit may include switching elements switched by the control signal to alternately select circuit elements which favor a rising edge and a falling edge. The switching elements may include CMOS transfer gates. The amplifier may include a differential amplifier. The amplifier may include a transconductance amplifier. The input signals may include analog signals and the receiver circuit preferably suppresses noise of the analog signals. The output preferably represents a digital logic state. The feedback loop may include delay elements such that noise after a transition in the input signals is suppressed for a delay period provided by the delay elements provided by the delay elements. The feedback loop may be programmable to adjust the delay period provided by the delay elements. The feedback loop may be controlled by a control circuit to adjust the delay period provided by the delay elements. The delay period may be controlled in accordance with an input signal input to the receiver circuit. A delay value of the delay elements may be less than half a clock period of the input signal. The at least one driver stage may include an inverter chain. The inverters of the inverter chain may include transistors, the inverters of the inverter chain having transistor strengths skewed relative to another inverter of the inverter chain to amplify one of the rising edge and the falling edge.

Another receiver circuit includes a first stage having an input for receiving input signals and an output node, the first stage including an amplifier. A second stage has an input coupled to the output of the first stage. The second stage includes an inverter coupled to the output of the first stage, the inverter having an output representing the output of the receiver circuit and including transistors, a first transistor coupled between the output of the inverter and a supply voltage, a second transistor coupled between the output of the inverter and a ground, wherein the first and second transistors have different strengths relative to the transistors of the inverter to favor a transition edge being driven to suppress noise after the transition edge. A feedback loop is coupled from the output of the inverter for enabling switching elements, the switching elements being switched in accordance with the output of the inverter to favor the transition edge being driven at the output of the inverter. A first driver stage is integrated into the second stage and coupled to the switching elements for favoring the falling edge in accordance with the control signal. A second driver stage is integrated into the second stage and coupled to the switching elements for favoring the rising edge in accordance with the control signal, the first and second driver stages for shaping and driving pulses output from the second stage.

In other embodiments, the first transistor may include a P-channel transistor, and the inverter may include an N-channel transistor and a relative strength ratio between the P-channel transistor and the N-channel transistor is between about 3:1 to about 10:1. The second transistor may include an N-channel transistor, and the inverter may include a P-channel transistor and a relative strength ratio between the N-channel transistor and the P-channel transistor is between about 3:1 to about 10:1. The circuit may include at least one current source coupled to each or the first driver stage and the second driver stage to provide driving current to a gate of one of the first and second transistors through the respective driver stage in accordance with the control signal. The amplifier may include a differential amplifier or a differential transconductance amplifier. The feedback loop may include delay elements such that noise after a transition in the input signals is suppressed for a delay period provided by the delay elements provided by the delay elements. Each of the first driver stage and the second driver stage may include an inverter chain. The inverters of each inverter chain may include transistors, the inverters of each inverter chain having transistor strengths skewed relative to another inverter of the same inverter chain to amplify one of the rising edge and the falling edge.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention includes a circuit that combines a receiving function (e.g., converting an analog signal to CMOS) and a driving function (driving a significant load of several pF) into a single circuit configuration. In one embodiment, delay is reduced by at least about 25% over the prior art.

The present invention will be described in terms of an illustrative circuit using field effect transistors; however, the present invention should not be construed as limited by the illustrative circuits. Instead, variations to the circuits described herein, as well as, other circuits and logic standards (e.g., SSTL, TTL, LVTTL, GTL, etc.) may enjoy the benefits of the present invention.

Figure 2A:
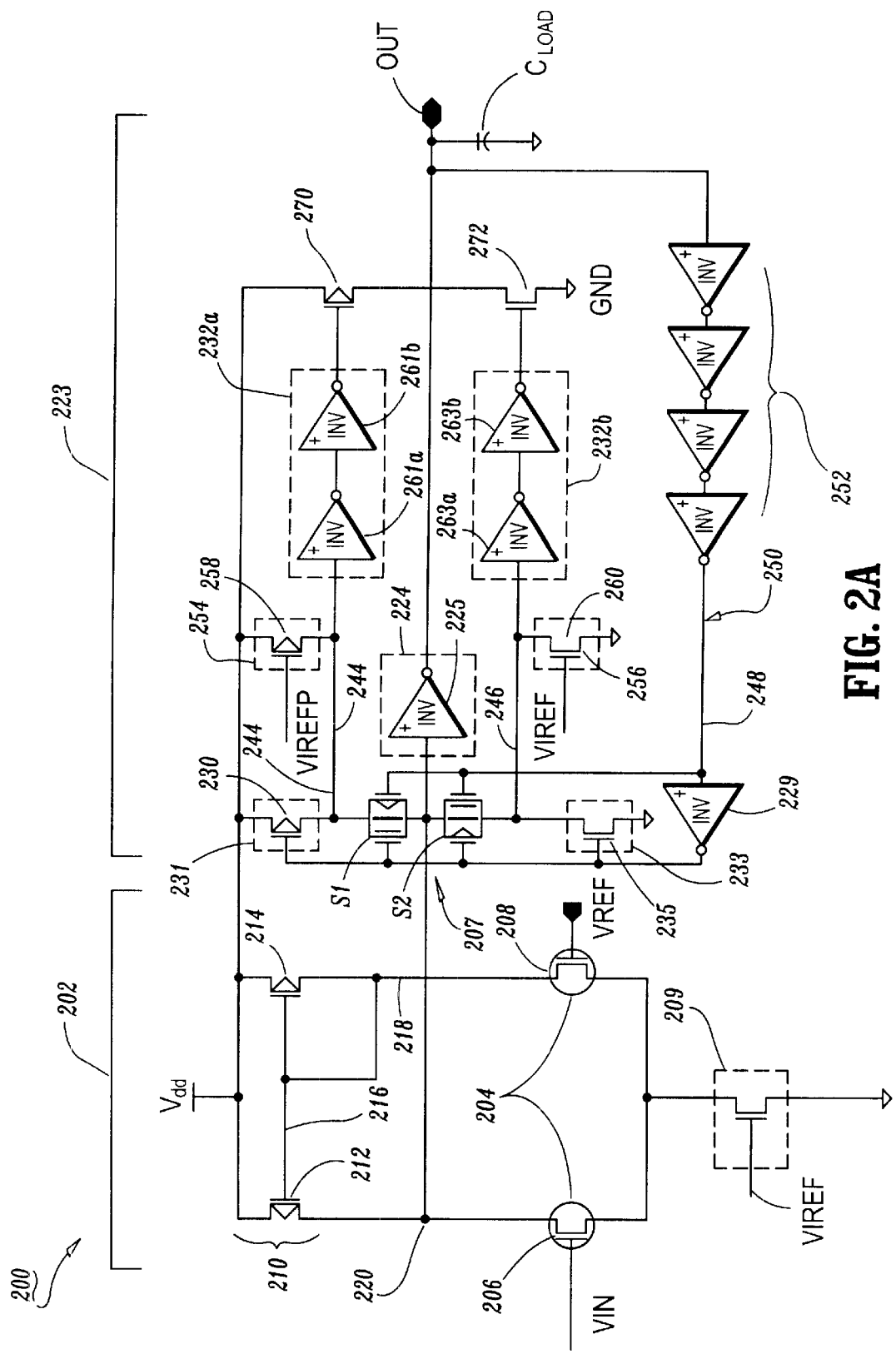
FIG. 2A is a schematic diagram showing a receiver/driver circuit in accordance with one embodiment of the present invention.

Referring now in specific detail to the drawings in which like reference numerals identify similar or identical elements throughout the several views, and initially to FIG. 2A, an illustrative circuit 200 is shown in accordance with one embodiment of the present invention. Circuit 200 includes a first stage 202, which includes an amplifier; preferably, a differential amplifier employed for noise suppression, and more preferably, a transconductance differential amplifier. Other amplifiers may be employed for first stage as well, for example a folded cascode amplifier circuit 200 includes an input (VIN) which preferably receives analog signals. First stage 202 may include an N-channel differential pair 204. A first N-channel transistor 206 has a gate connected to VIN for receiving input signals. A second N-channel transistor 208 includes a gate connected to a reference voltage VREF.

A P-channel current mirror 210 is also included. A first transistor 212 and a second transistor 214 of P-channel current mirror 210 include gates, which are connected at node 216. The gates of transistors 212 and 214 are also connected to node 218. A node 220 is connected to transistors 212 and 206. Node 220 i s a n output node of first stage 202 (output of the differential amplifier) and connects to a second stage 223.

Second stage 223 of circuit 200 includes a logic gate 224, such as an inverter, an AND gate, an OR gate or other logic gate. For this illustrative example, gate 224 includes an inverter 225. Inverter 225 includes a PFET and an NFET as is known in the art. Second stage 223 may provide a reverse (negative) or positive hysteresis to the output (OUT) of circuit 200, as will be explained in greater detail below.

Analog output node 220 of the single stage differential amplifier of first stage 202 is connected to second stage 223.

Figure 2C:
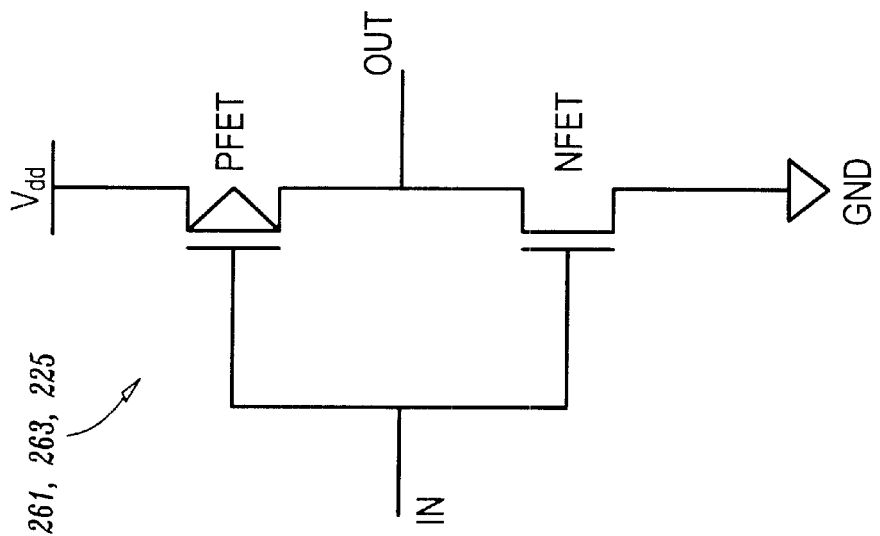
FIG. 2C is a schematic diagram illustratively showing inverters of the circuit of FIG. 2A for the present invention.

Second stage 223 includes driver stages 232a and 232b. Driver stages 232 (a and b) are illustratively shown in this example as a pair of simple heavily skewed inverter chains. Note that a driver stage of the prior art require a full digital signal input to function properly, the present invention, advantageously, is crafted to permit analog or digital inputs from the first stage to the second stage. This is provided by current sources and the circuits described below. Driver stages 232 shape and amplify output pulses of circuit 200. Skewing as described herein is provided by adjusting the delays of the respective inverters. Skewing of the inverter chains of driver stages 232 is preferably achieved by providing different strengths to transistors which make up inverters 261a, 261b, 263a, and 263b. Each inverter includes a PFET transistor and an NFET transistor as shown in FIG. 2C.

In a preferred embodiment, PFET and NFET transistors of inverter 261b are four times stronger than PFET and NFET transistors of inverter 261a. Also, PFET and NFET transistors of inverter 263b are four times stronger than PFET and NFET transistors of inverter 263a. For inverter 261a, the strength of the PFET to NFET is 3 to 1 to about 10 to 1, respectively. For inverter 261b, the strength of the PFET to NFET is 1 to 3 to about 1 to 10, respectively. For inverter 263a, the strength of the PFET to NFET is 1 to 3 to about 1 to 10, respectively. For inverter 263b, the strength of the PFET to NFET is 10 to 1 to about 3 to 1, respectively.

Inverter 225 includes a PFET and an NFET (See FIG. 2C) which are skewed relative to driver transistors 270 and 272. Second stage 223 provides a switching capability for skewing the driving power to favor one of rising or falling edges. In this way, the skewing provides noise suppression during a delay period after a valid transition (from rising to falling or vice versa). Circuit 200 preferably provides hysteresis to the output (OUT).

Figure 4:
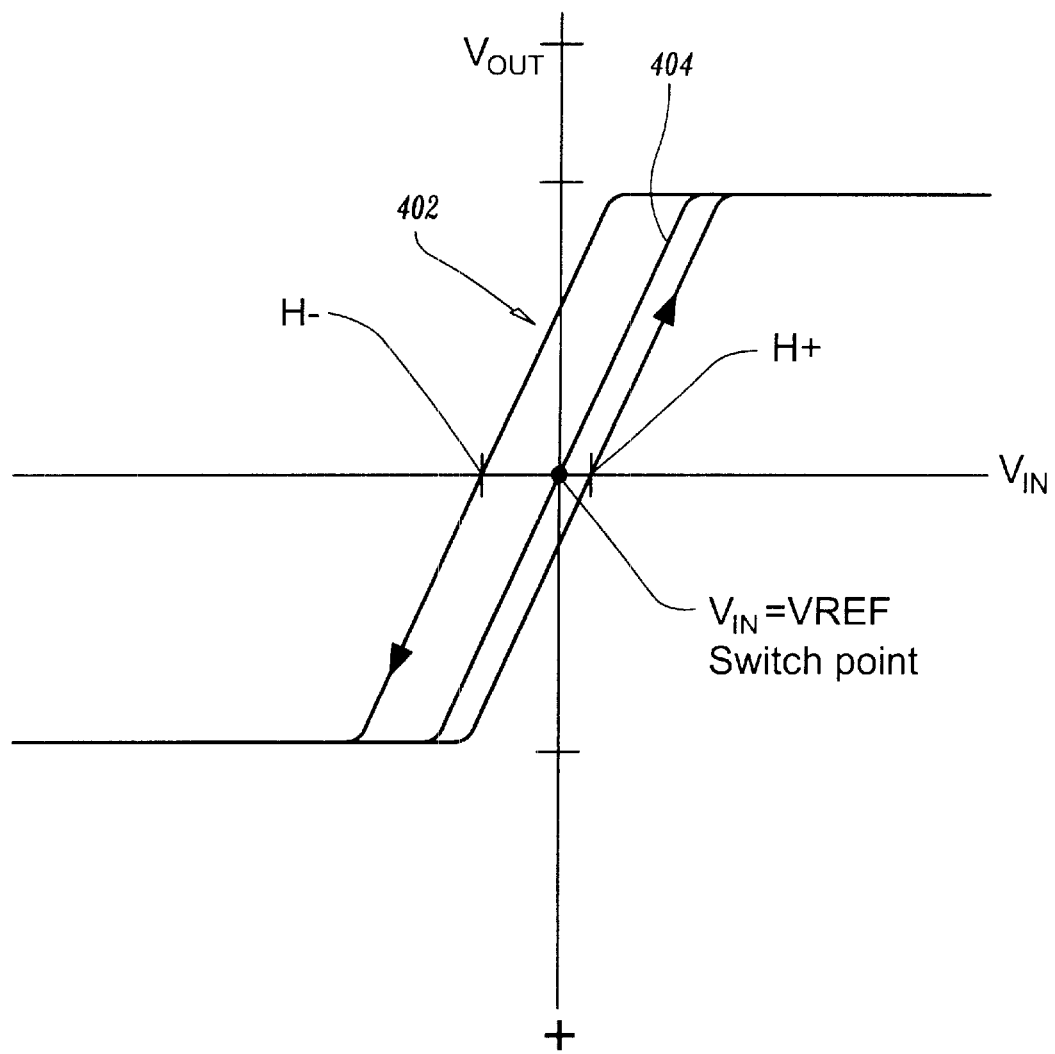
FIG. 4 is a plot showing hysteresis for switch point adjustment in accordance with the present invention.

The overall transfer characteristics of circuit 200 includes hysteresis as indicated e.g., in FIG. 4. In the circuit 200, reverse hysteresis may be introduced by heavy skew of a transistor 270 relative to the NFET of inverter 225 (FIG. 2C). Skewing as described herein is provided by adjusting the delays/strengths of the respective transistors. This adjustment may be provided by transistor strength adjustment, which is related to the size of the transistor.

A switching circuit 207 is coupled to the output node of the first stage for driving signals through circuit 200 in accordance with a control signal. The heavy skew between transistor 270 relative to the NFET on inverter 225 is provided for a transition of VIN from LOW to HIGH (rising). During this transition a first transfer gate S1 is conducting (switch 231 is open) to provide current to the output OUT through inverter 225. Similarly, for a transition of VIN from HIGH to LOW (falling), a transfer gate switch S2 is conducting (switch 233 is open) and the heavy skew is reversed.

For a LOW to HIGH transition at VIN, stage 223 favors a rising edge by making switch S1 and switch 233 conduct. When switches S1 and 233 conduct the output at node 220 is skewed since the NFET of inverter 225 has a strength ratio with PFET 270 of between about 1:3 to about 1:10. This skew helps to suppress any noise after a transition (slope reversal).

In the example, for a HIGH to LOW transition of VIN, stage 223 favors a falling edge by making switch S2 and switch 231 conduct. When switches S2 and 231 conduct the output at node 220 is skewed since the PFET of inverter 225 has a strength ratio with NFET 272 of between about 1:3 to about 1:10. Again, this skew helps to suppress any noise after the transition.

Transistor 270 is driven by node 220 through gate S1, if conducting. If S1 is not conducting, then switch 231 (transistor 230) is on to pull node 244 to Vdd and switch off transistor 270. Transistor 272 is driven by node 220 through gate S2, if conducting. If S2 is not conducting, then switch 233 (transistor 235) is on to pull node 246 to ground and switch off transistor 272.

Transistor 272 is skewed versus the PFET of inverter 225, transistor 270 is skewed versus the NFET of inverter 225. As a result of heavy skew provided above noise suppression for dynamic switching is realized and reverse hysteresis of circuit 200 may occur. In accordance with the present invention, this reverse hysteresis may be compensated for by providing current adjustment at nodes 244 and 246. The current adjustment may be realized by including current sources 254 and 256.

Figure 2B:
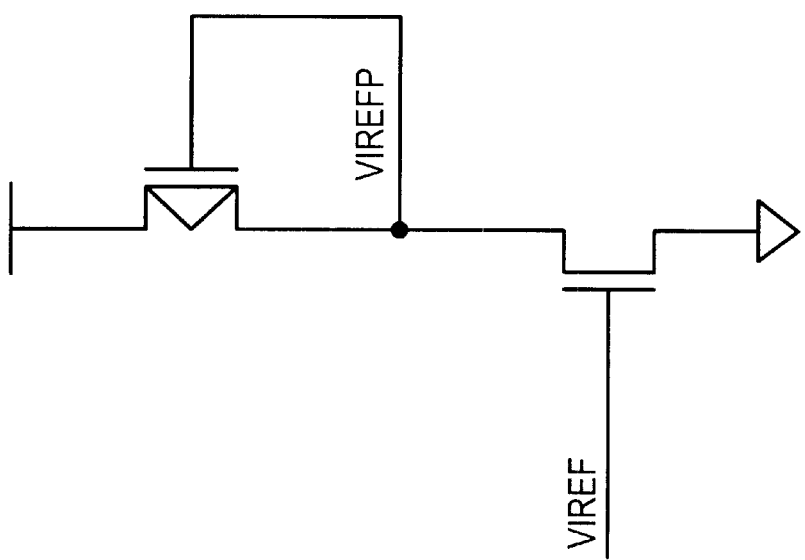
FIG. 2B is a schematic diagram illustratively showing a circuit for generating a reference voltage for the present invention.

In a preferred embodiment, current sources 254 and 256 supply current proportional to the current of current source 209. This may be achieved by employing the same gate voltage VIREF (or VIREFP for P-channel transistors, as provided by the illustrative circuit of FIG. 2B). Since the skewing of second stage 223 may affect hysteresis, hysteresis of circuit 200 is compensated for or adjusted to achieve the desired amount of hysteresis (e.g., about 10 to 50 mV) for circuit 200.

Transfer gates S1 and S2 are illustratively shown as CMOS gates, other arrangements and configurations are also contemplated. Gates S1 and S2 (and switches 231 and 235) are activated/deactivated in accordance with feedback from OUT. An inverter 229 is employed to reverse the polarity of the signal across gates S1 and S2.

In one embodiment, current sources 254 and 256 include transistors. A transistor 258 is employed as a current source with a connection to supply voltage Vdd, while a transistor 260 is employed as a current source with a connection to ground GND. Other current source configurations may also be employed.

Response time of circuit 200 is dependent on the current state through switches S1 and S2. However, the static switching levels only slightly depend on the setting of the two switches S1 and S2. This slight difference of the switching points for the falling and rising transitions can be compensated by current sources 254 and 256. These current sources 254 and 256 supply a small percentage (for example, about 5–10%) of the differential amplifier supply current (e.g., current through current source 209. Current sources 254 and 256 may be sized to adjust the amount of hysteresis for a given application (See FIG. 4).

As the gate voltages of transistors 258 and 260 are derived from the gate voltage of the current source 209 of the differential amplifier of first stage 202 the percentage ratio of supply current is well controlled to nodes 244 and 246.

Advantageously, due to nodes 244 and 246 having a high impedance, a small current has a significant effect on the switching levels while not dramatically adding to the delay. Circuit 200 of the present invention permits transition switching which is immune from noise of the input signal since the skewing of stage 223 favors only rising or falling edges at a given time. The reverse hysteresis due to the skewing, for example, transistor strength skewing of stage 223, is compensated for by employing current sources 254 and 256. Other current source configurations may also be employed. Advantageously, the present invention suppresses noise spikes after transitions for a predetermined amount of time after a transition. This predetermined amount of time may be provided by delay in a feedback loop 250. Feedback loop 250 is provided between output OUT and node 248 and is employed to control switches S1 and S2. Feedback loop 250 preferably includes delay elements 252 (in this case inverter pairs) to delay this feedback control signal. Inverter pairs may be selected which provide about a 2 ns delay to the feedback control signal. This delay period (or suppression of noise period) may be modified as needed. For example, the delay period may be modified by trimming, deriving delay as a portion of clock frequency, providing a control signal to enable delay elements (control may be from a delay locked loop (DLL) or a phase locked loop (PLL)), etc.

By skewing inverter chains 232a and 232b, inverter chain 232a favors falling edges on node 220 while inverter chain 232b favors rising edges on node 220. By skewing these inverter chains of drivers stages 232, as described above, and integrating driver stages 232 into circuit 200, the signal on node 220 is amplified much faster. As a result the rising (or falling) clock edge is more than 25% faster (e.g., 400 ps out of 1.5 ns). Advantageously, in this implementation of the present invention, the inverter chain for rising edge 232a and the inverter chain for the falling edge 232b are provided to yield similar delay values for each edge. The present invention is also capable of providing different delays between the rising and falling edges (e.g., by changing transistor strengths/sizes).

Inverters of driver stages 232 provide pulse widths of the output signals as driven by driver transistors 270 and 272. Driver transistors 270 and 272 drive the output signals in accordance with feedback loop 250.

Reverse hysteresis introduced by the skewed drivers of the inverter chains 232a and 232b can cause oscillations in the case where VIN is equal or close to VREF. This oscillation period would be about twice the delay of feedback loop 250 determined by inverter chain 252. By introducing (positive) hysteresis through current feedback via current sources 254 and 256 (shown for example as transistors 258 and 260) the resulting overall hysteresis is positive thus suppresses oscillation and provides additional noise immunity.

Driver stages 232 are controlled by feedback loop 250 by employing transfer gates or switches S1 and S2 (e.g., CMOS gates). Transfer gates S1 and S2 are illustratively shown as CMOS gates, other arrangements and configurations are also contemplated. By controlling switches S1 and S2 from the output of the driver stage (OUT), the amplifier output node 220 is less loaded and thus faster.

Transistor 258 is biased by VIREFP (Voltage Reference Current P), which is generated by another circuit (see, e.g., FIG. 2B) from VIREF. Similarly, transistor 260 is biased by VIREF (Voltage Reference Current).

Current sources 254 and 256 may be sized to adjust the amount of hysteresis for a given application (See FIG. 4). As the gate voltages of transistors 258 and 260 are derived from the gate voltage of the current source 209 of the differential amplifier of first stage 202 (VIREF; see FIG. 2B) the percentage ratio of supply current is well controlled.

Figure 1:
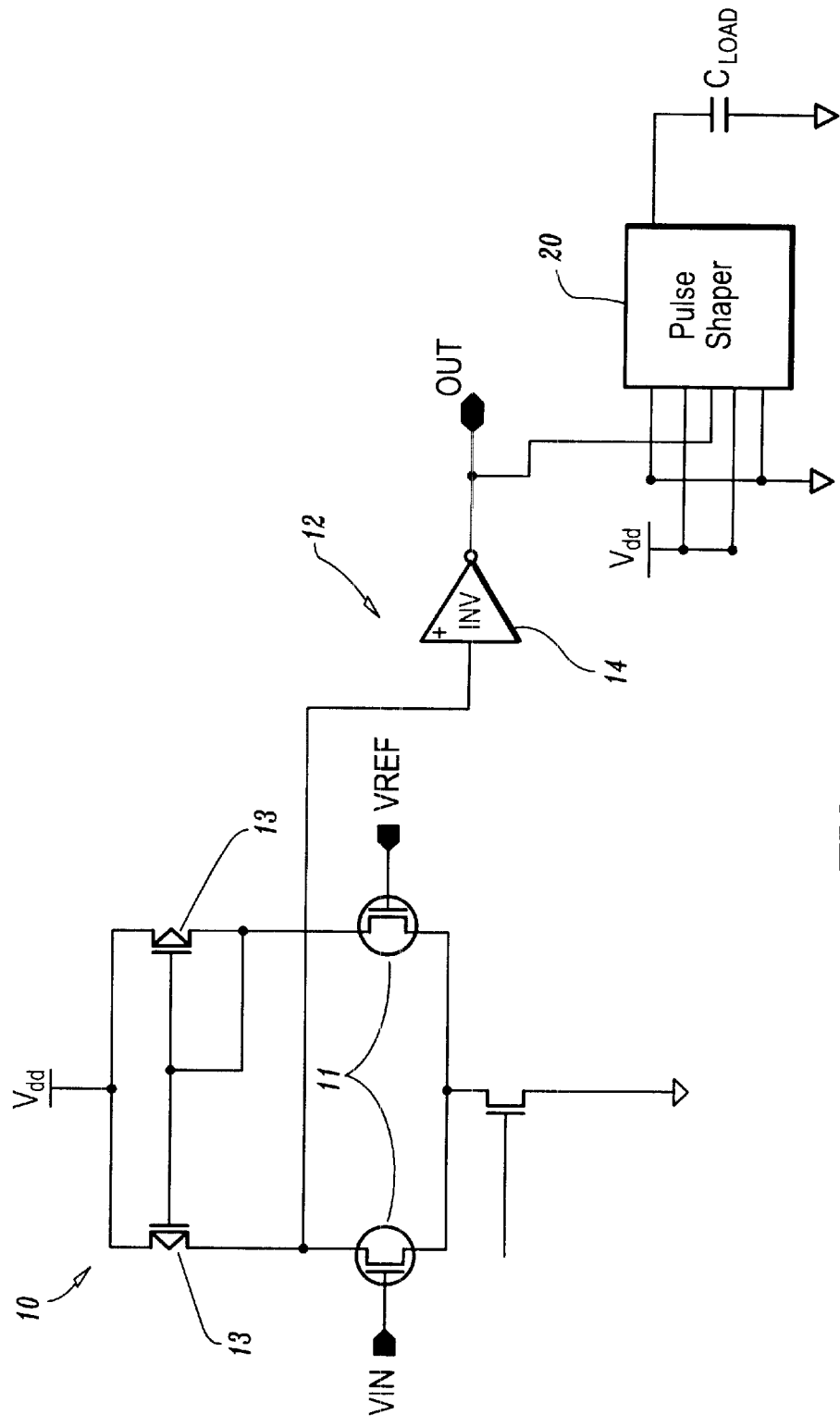
FIG. 1 is a schematic diagram showing a prior art receiver circuit with a one-shot pulse shaper coupled to the output.
Figure 3:
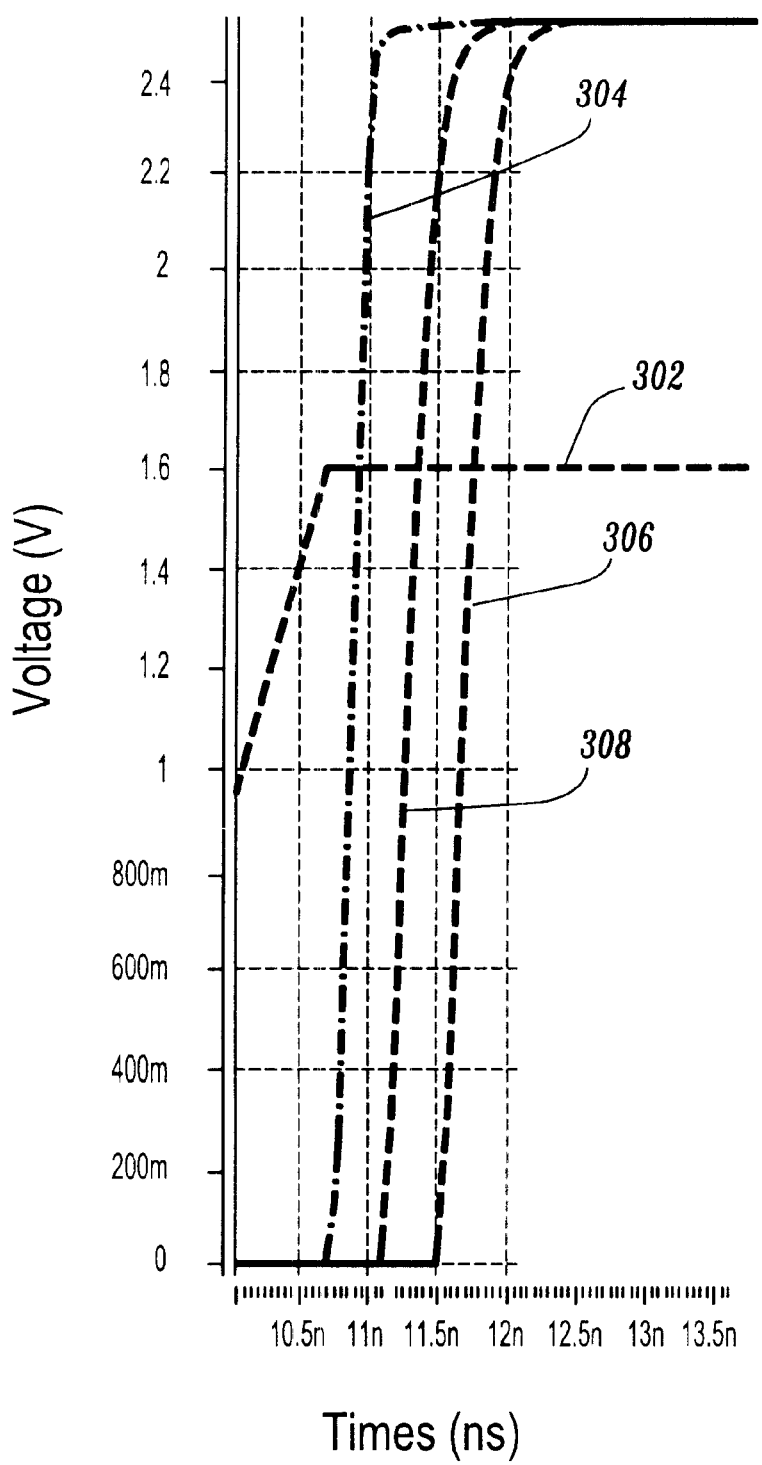
FIG. 3 is a plot comparing response waveforms response the conventional circuit of FIG. 1 with the response of circuit of FIG. 2A in accordance with the present invention.

Referring to FIG. 3, waveforms of the conventional approach (FIG. 1) and the approach of the present invention (FIG. 2A) for $C_{Load}$=4pF and the size (e.g., width) of a drivers 270 and 272, are for example, Wp=260 mm (for driver 270) and Wn=100 mm (for driver 272) respectively. An input waveform 302, for example, an SSTL-2 waveform, is input at VIN. An output waveform 304 for the conventional receiver (FIG. 1) is shown, and an output waveform 306 after the conventional driver stage 20 (FIG. 1) is shown. An output waveform 308 is also shown for the combined receiver/driver of the present invention (FIG. 2A). In this illustrative example, a dramatic 25% reduction in delay is achieved (e.g., 400 ps out of 1.5 ns is saved).

In FIG. 4, a hysteresis window 402 is shown. Hysteresis H may be adjusted about a nominal switch point (e.g., on the line 404 the switch point is where VIN=VREF). In one embodiment, H+ and H− are equal (e.g., symmetric about the switch point), however, H+ and H− may be adjusted about the nominal switch point as needed, in accordance with the invention by developing a skew between strength of transistors in driver stages 232 (and transistors 270 and 272) and/or transistors of inverter 225 (FIG. 2A) or by sizing current sources 254 and 256 to compensate for an amount of hysteresis provided by the skewing for a given application.

In the integrated approach of the present invention, a converter stage (analog to digital) and a driver stage are combined in a single circuit to reduce complexity and delay. The analog node (output of first stage) is coupled directly to the input of the skewed driver stage, and separate driver stages are provided for rising and falling edges. The analog node is coupled to the driver stages by transfer-gate switches which are controlled by the output of receiver-driver configuration of the present invention. In a preferred embodiment, oscillations due to noise after transitions are suppressed by hysteresis. The driver stage may include inverter stages as shown in FIG. 2A.

Figure 5:
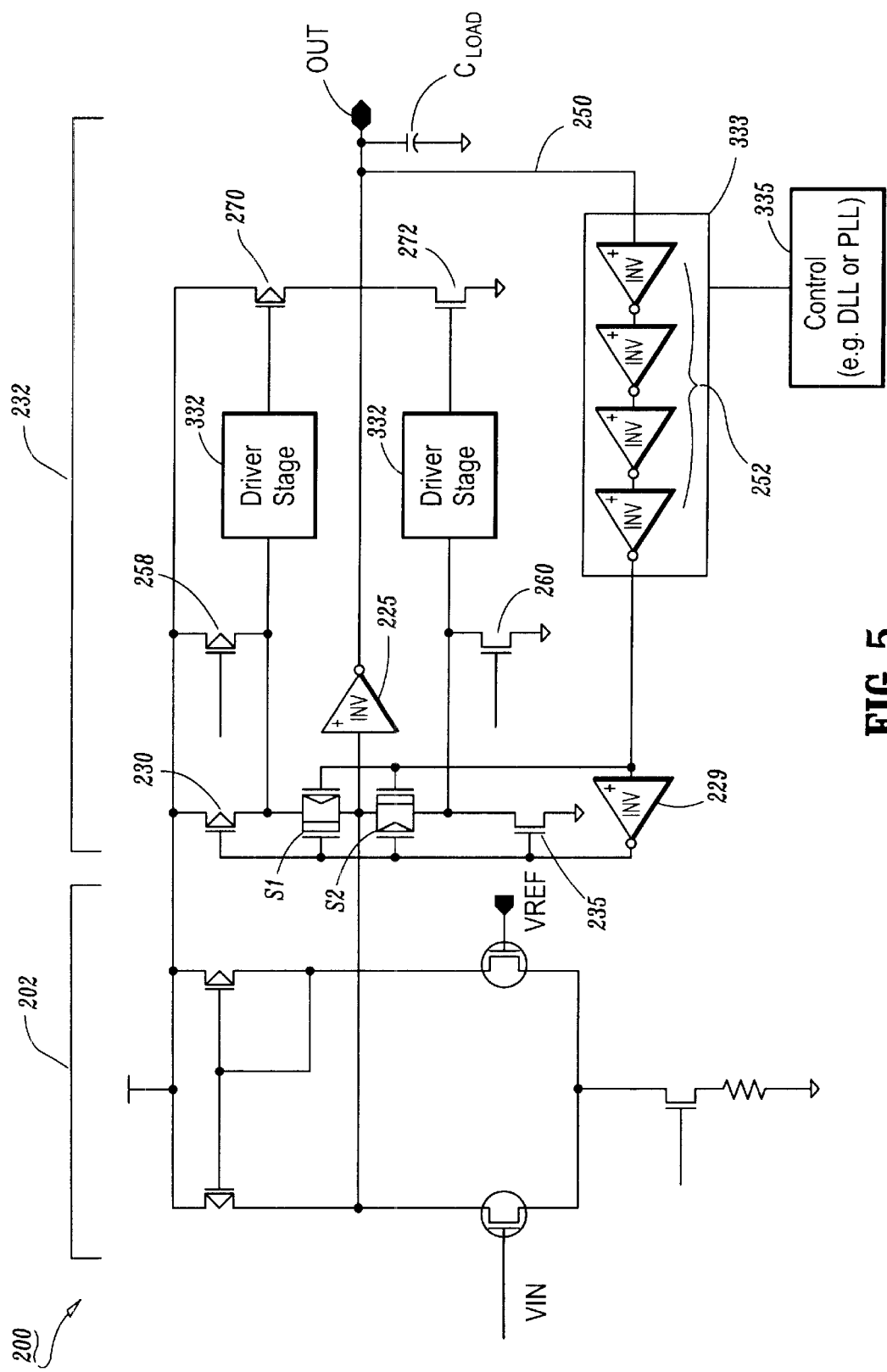
FIG. 5 is a schematic diagram showing a receiver/driver circuit in accordance with another embodiment of the present invention.

In another preferred embodiment as shown in FIG. 5, a driver stage 332 may include a self-reset driver (in the case where both clock edges are relevant, e.g., in double data rate designs) or a one-shot pulse generator (possibly a self-reset type). FIG. 5 may include a delay line 333, which includes a plurality of delay elements (e.g., inverters 252). Delay line 333 may be controlled or is programmable to modify the delay thereof. A control circuit 335 includes a circuit for deriving delay. Delay may be derived as a portion (e.g., percent fraction) of clock frequency, for example. A control signal may be provided from control circuit 335. Control circuit 335 may include for example, a DLL or a PLL, or other programmable circuits for programming delay in delay line 333. In an alternate embodiment, delay may be provided by trimming delay elements to provide an appropriate delay in delay line 333.

It is to be understood that the present invention may be employed in a plurality of different applications. For example, the present invention may be implemented on a semiconductor memory chip or other semiconductor device for receiving analog input signals (clock signals) and converting the input signals to digital pulses after noise suppression. Other applications may include, but are not limited to telephony or signal processing applications. The circuits of the present invention may be employed with other functions as well, for example, as a comparator. By adjusting hysteresis in accordance with the present invention, time is conserved by the overall circuit, noise is efficiently suppressed and the reliability of the received signals is improved.

In one embodiment, p-channel transistors may be desirable at appropriate locations in the circuits to provide SSTL, LVCMOS, CMOS logic or other logic. (SSTL is stub series terminated logic, known to those skilled in the art.) In other embodiments, n-channel transistors are desirable. It is to be understood that the circuits of the present invention may have p-channel devices replaced by n-channel devices (or vice versa) as would be understood to one skilled in the art.

Having described preferred embodiments for circuit for receiving and driving a clock-signal (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A receiver circuit, comprising:
a first circuit having two modes of operation controlled by a feedback loop, the feedback loop being connected to an output of the first circuit, the modes of operation including:
a first mode having a quicker response to an input falling signal edge than a second mode; and
the second mode with a quicker response to an input rising signal edge than the first mode; and
a driver stage integrated into the first circuit to favor the rising edge or the falling edge in accordance with a control signal provided by the feedback loop.

2. The receiver circuit as recited in claim 1, wherein the driver stage includes an inverter chain.

3. The receiver circuit as recited in claim 2, wherein the inverter chain includes NMOS and PMOS transistors, the NMOS and the PMOS transistors having skewed strengths to favor one of the rising and falling edges.

4. The receiver circuit as recited in claim 1, wherein the driver stage is capable of driving digital and analog signals input thereto.

5. The receiver circuit as recited in claim 1, further comprising at least one current source coupled to the driver stage to provide driving current to the output in accordance with the control signal.

6. The receiver circuit as recited in claim 1, wherein the first circuit includes a switching circuit having switching elements switched by the control signal to alternately select circuit elements which favor a rising edge and a falling edge.

7. The receiver circuit as recited in claim 1, wherein the first circuit includes a differential amplifier.

8. The receiver circuit as recited in claim 1, wherein the feedback loop includes delay elements such that noise after a transition in the input signals is suppressed for a delay period provided by the delay elements.

9. The receiver circuit as recited in claim 8, wherein the feedback loop is programmable to adjust the delay period provided by the delay elements.

10. The receiver circuit as recited in claim 8, wherein the feedback loop is controlled by a control circuit to adjust the delay period provided by the delay elements.

11. The receiver circuit as recited in claim 10, wherein the delay period is controlled in accordance with an input signal input to the receiver circuit.

12. A receiver circuit comprising:
a first stage having an input for receiving input signals and an output node, the first stage including an amplifier;
a second stage having an input coupled to the output of the first stage, the second stage further comprising:
a switching circuit coupled to the output node of the first stage for driving the input signals by favoring one of a rising edge or a falling edge in accordance with a control signal;
a feedback loop coupled to an output of the second stage, the feedback loop providing the control signal for switching the switching circuit to favor the rising edge or falling edge;
at least one driver stage integrated into the second stage and coupled to the switching circuit for favoring the rising edge or the falling edge in accordance with the control signal.

13. The receiver circuit as recited in claim 12, wherein the second stage includes an inverter coupled to the output of the first stage, the inverter having an output representing the output of the receiver circuit.

14. The receiver circuit as recited in claim 13, wherein the second stage includes:
a first transistor coupled between the output of the inverter and a supply voltage; and
a second transistor coupled between the output of the inverter and a ground, wherein the first and second transistors have different strengths relative to transistors of the inverter to provide skewed driver strength for driving the input signals to the output of the second stage.

15. The receiver circuit as recited in claim 14, wherein the at least one driver stage includes a first driver stage coupled to a gate of the first transistor and coupled to the switching circuit.

16. The receiver circuit as recited in claim 14, wherein at least one driver stage includes a second driver stage coupled to a gate of the second transistor and coupled to the switching circuit.

17. The receiver circuit as recited in claim 14, wherein the second stage includes:
at least one current source coupled to the at least one driver stage to provide driving current to a gate of one of the first and second transistors through the at least one driver stage in accordance with the control signal.

18. The receiver circuit as recited in claim 12, wherein the switching circuit includes switching elements switched by the control signal to alternately select circuit elements which favor a rising edge and a falling edge.

19. The receiver circuit as recited in claim 18, wherein the switching elements include CMOS transfer gates.

20. The receiver circuit as recited in claim 12, wherein the amplifier includes a differential amplifier.

21. The receiver circuit as recited in claim 12, wherein the amplifier includes a transconductance amplifier.

22. The receiver circuit as recited in claim 12, wherein input signals include analog signals and the receiver circuit suppresses noise of the analog signals.

23. The receiver circuit as recited in claim 12, wherein the output represents a digital logic state.

24. The receiver circuit as recited in claim 12, wherein the feedback loop includes delay elements such that noise after a transition in the input signals is suppressed for a delay period provided by the delay elements provided by the delay elements.

25. The receiver circuit as recited in claim 24, wherein the feedback loop is programmable to adjust the delay period provided by the delay elements.

26. The receiver circuit as recited in claim 24, wherein the feedback loop is controlled by a control circuit to adjust the delay period provided by the delay elements.

27. The receiver circuit as recited in claim 24, wherein the delay period is controlled in accordance with an input signal input to the receiver circuit.

28. The receiver circuit as recited in claim 24, wherein a delay value of the delay elements is less than half a clock period of the input signal.

29. The receiver circuit as recited in claim 12, wherein the at least one driver stage includes an inverter chain.

30. The receiver circuit as recited in claim 29, wherein the inverters of the inverter chain include transistors, the inverters of the inverter chain having transistor strengths skewed relative to another inverter of the inverter chain to amplify one of the rising edge and the falling edge.

31. A receiver circuit comprising:
a first stage having an input for receiving input signals and an output node, the first stage including an amplifier;
a second stage having an input coupled to the output of the first stage, the second stage further comprising:
an inverter coupled to the output of the first stage, the inverter having an output representing the output of the receiver circuit and including transistors;
a first transistor coupled between the output of the inverter and a supply voltage;
a second transistor coupled between the output of the inverter and a ground, wherein the first and second transistors have different strengths relative to the transistors of the inverter to favor a transition edge being driven to suppress noise after the transition edge;
a feedback loop coupled from the output of the inverter for enabling switching elements, the switching elements being switched in accordance with the output of the inverter to favor the transition edge being driven at the output of the inverter;
a first driver stage integrated into the second stage and coupled to the switching elements for favoring the the falling edge in accordance with the control signal; and
a second driver stage integrated into the second stage and coupled to the switching elements for favoring the the rising edge in accordance with the control signal, the first and second driver stages for shaping and driving pulses output from the second stage.

32. The receiver circuit as recited in claim 31, wherein the first transistor includes a P-channel transistor and the inverter includes an N-channel transistor and a relative strength ratio between the P-channel transistor and the N-channel transistor is between about 3:1 to about 10:1.

33. The receiver circuit as recited in claim 31, wherein the second transistor includes an N-channel transistor and the inverter includes an P-channel transistor and a relative strength ratio between the N-channel transistor and the P-channel transistor is between about 3:1 to about 10:1.

34. The receiver circuit as recited in claim 31, further comprising at least one current source coupled to each or the first driver stage and the second driver stage to provide driving current to a gate of one of the first and second transistors through the respective driver stage in accordance with the control signal.

35. The receiver circuit as recited in claim 31, wherein the amplifier includes one of a differential amplifier and a transconductance amplifier.

36. The receiver circuit as recited in claim 31, wherein the feedback loop includes delay elements such that noise after a transition in the input signals is suppressed for a delay period provided by the delay elements provided by the delay elements.

37. The receiver circuit as recited in claim 31, wherein each of the first driver stage and the second driver stage includes an inverter chain.

38. The receiver circuit as recited in claim 37, wherein the inverters of each inverter chain include transistors, the inverters of each inverter chain having transistor strengths skewed relative to another inverter of the same inverter chain to amplify one of the rising edge and the falling edge.

* * * * *